United States Patent [19]
Kewley et al.

[11] 4,093,979
[45] June 6, 1978

[54] MULTIPLE FLASH ARRAY

[75] Inventors: Norman E. Kewley, Pepper Pike; Andrew Smetana, Mentor, both of Ohio

[73] Assignee: General Electric Company, Schenectady, N.Y.

[21] Appl. No.: 711,615

[22] Filed: Aug. 4, 1976

[51] Int. Cl.² .............................................. G03B 15/02
[52] U.S. Cl. ......................................... 362/5; 362/13; 362/16
[58] Field of Search ................ 240/1.3; 431/93, 95 R, 431/95 A; 362/5, 11, 13, 16, 17

[56] References Cited
U.S. PATENT DOCUMENTS

| | | | |
|---|---|---|---|
| 3,380,357 | 4/1968 | Harvey | 240/1.3 X |
| 3,583,841 | 6/1971 | Harvey | 431/93 |
| 3,668,421 | 6/1972 | Bowers | 240/1.3 X |
| 3,692,995 | 9/1972 | Wagner | 240/1.3 |
| 3,707,903 | 1/1973 | Weber | 354/128 |
| 3,714,407 | 1/1973 | Bowers | 240/1.3 |
| 3,935,442 | 1/1976 | Hanson | 240/1.3 |

Primary Examiner—Fred L. Braun
Attorney, Agent, or Firm—Norman C. Fulmer; Lawrence R. Kempton; Frank L. Neuhauser

[57] ABSTRACT

A multiple flash lamp array having an electrically conductive reflector unit positioned between the flash lamps and a circuit board. A radiation-actuated last-flash indicator switch is positioned on the circuit board behind the last lamp to be flashed and is connected between an electrical ground circuit run and another circuit run. An opening is provided through the reflector at the last-to-flash lamp, in alignment with the last-flash indicator switch, and the rear edge of the opening is shaped to contact the electrical ground circuit run adjacent to the last-flash indicator switch for electrically grounding the reflector.

13 Claims, 4 Drawing Figures

U.S.Patent June 6, 1978 4,093,979
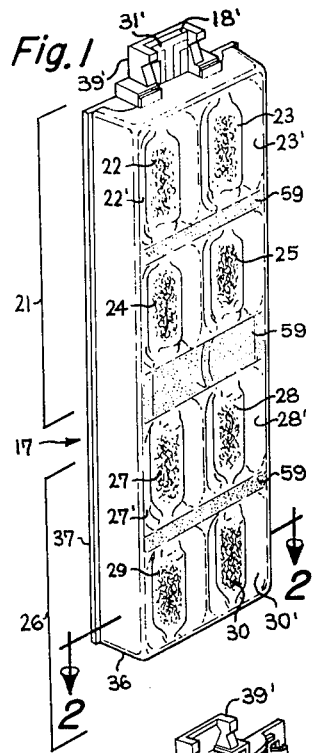

MULTIPLE FLASH ARRAY

CROSS-REFERENCES TO RELATED APPLICATIONS

Ser. No. 655,005, filed Feb. 4, 1976, now abandoned James M. Hanson et al., "Photoflash Lamp Array Having Conductive Reflector," assigned the same as this invention.

Ser. No. 702,663, filed July 6, 1976, Paul T. Coté, "Last Flash Indicator for Photoflash Array," assigned the same as this invention.

BACKGROUND OF THE INVENTION

The invention is in the field of multiple photoflash lamp arrays.

U.S. Pat. No. 3,935,442 to Hanson describes a flash array of the "FlipFlash" type having a plurality of flash lamps connected to a circuit board having circuitry for sequentially flashing the lamps. A metal-coated plastic reflector unit, shaped to provide individual reflectors for the lamps, is positioned between the lamps and the circuit board, and a metal clip is clipped to the reflector and rests against an electrical ground area of the circuit board so as to electrically ground the reflector and thus increase the stray capacitance of the array's electrical ground to surrounding space, thereby reducing the possibility of accidental flashing of the lamps when electrostatically charged persons or objects touch the array.

The above-referenced Hanson patent application discloses an alternative way of connecting the conductive reflector unit to electrical ground of the circuit board, comprising one or more openings through the rear of the reflector unit aligned with electrical ground pads of the circuit board and shaped to bring a metal coating on the front of the reflector unit against or near to the electrical ground pads. For the purpose of electrically grounding the reflector unit to the circuit board for dissipating any electrostatic charges applied to the array, the connection therebetween need not be a direct contact because electrostatic charges that are likely to cause accidental flashing of the lamps will be about a thousand volts or more (at low energy) and can arc across a short gap between electrical ground of the circuit board and the metal of the reflector unit.

The above-referenced Coté patent application discloses a last-flash indicator arrangement comprising a radiation-actuated switch near the last-to-flash lamp and connected electrically across the input terminals of the array. When the last lamp flashes, the indicator switch changes the resistance across the array's input terminals and actuates a last-flash indicator in the camera.

SUMMARY OF THE INVENTION

Objects of the invention are to provide an improved construction of a FlipFlash type of flash array and to reduce its manufacturing cost.

The invention comprises, briefly and in a preferred embodiment, a multiple flash lamp array having a plurality of flash lamps connected to a circuit board carrying circuitry for sequentially flashing the lamps. An electrically conductive reflector unit is positioned between the lamps and the circuit board, and may be made of plastic with a metal coating on its front and/or back surface. A radiation-actuated last-flash indicator switch is positioned on the circuit board behind the last lamp to be flashed and is connected electrically between circuit runs which are connected to connector terminals of the array, one of which is electrical ground for the array. An opening is provided through the reflector unit between the last-to-flash lamp and the last-flash indicator switch, and the rear edge of the opening is contoured to bring the metal coating of the reflector against or near to the electrical ground run adjacent to the last-flash indicator switch so as to electrically ground the reflector for electrostatic charges. The electrical ground run can be widened or shaped like a pad in the vicinity of the last-flash indicator switch to facilitate the grounding of the reflector. The rear edge of the reflector opening can be contoured in the form of a rearwardly extending tab, and the inside surface of the tab can be tapered to facilitate its becoming metallized when the front surface of the reflector is metal coated such as by a vapor deposition technique. For a dual array such as the FlipFlash type, similar arrangements of indicator switches, electrical ground circuit runs, and reflector openings can be provided behind the last-to-flash lamp of each of the two groups of lamps.

BRIEF DESCRIPTION OF THE DRAWING

FIG. 1 is a perspective view of a flash array embodying the invention.

FIG. 2 is a cross-sectional view taken on the line 2—2 of FIG. 1.

FIG. 3 is a perspective exploded view of the array of FIG. 1.

FIG. 4 is a perspective view of a portion of the array at a last-to-flash lamp.

DESCRIPTION OF THE PREFERRED EMBODIMENTS

A multiple flash lamp unit 17 of the planar array type and containing a plurality of electrically fired flash lamps is provided with a plug-in connector tab 18 at the lower end thereof, adapted to fit into a socket of a camera or flash adapter. The lamp array 17 is provided with a second plug-in connector tab 18' at the top end thereof, whereby the array 17 is adapted to be attached to the camera socket in either of two orientations, i.e., with either the tab 18 or the tab 18' plugged into the socket. The array 17 is provided with an upper group 21 of flash lamps 22, 23, 24, and 25, and a lower group 26 of flash lamps 27, 28, 29, and 30, the lamps being arranged in a planar configuration. Reflectors 22', etc., are disposed behind the respective flash lamps, so that as each lamp is flashed, its light is projected forwardly of the array 17. The lamps are arranged and connected so that when the array is connected to a camera by the connector 18, only the upper group 21 of lamps will be flashed, and when the array is turned end for end and connected to the camera by the other connector 18', only the then upper group 26 of lamps will be flashed. By this arrangement, only lamps relatively far from the lens axis are flashable, thus reducing the undesirable red-eye effect.

The construction of the array comprises front and back housing members 36 and 37, which preferably are made of plastic and are provided with interlocking members 38 which can be molded integrally with the housing members and which lock the housing members together in final assembly to form a unitary flash array structure. FIG. 2 shows a pair of interlocking members 38a carried at the rear of the side of the front housing member 36 interlocked with a pair of interlocking members 38b of the back housing member 37. In the preferred embodiment shown, the front housing member 36 is a rectangular concavity and the back housing member 37 is substantially flat and includes integral extensions 39 and 39' at the ends thereof which partly surround and protect the connector tabs 18 and 18' and also function to facilitate mechanical attachment to the camera socket. Sandwiched between the front and back housing members 36 and 37, in the order named, are the flash lamps 22, etc., a unitary reflector unit 41, preferably plastic, coated on the front surface with a metal such as aluminum and shaped to provide the individual reflectors 22', etc., a printed circuit board 42 provided with integral connector tabs 18 and 18', and an indicia sheet 43 which may be provided with instructions, information, and other indicia such as flash indicators located behind the respective lamps.

The indicia sheet 43 may be of paper or thin cardboard and provided with openings where the flash indicators are desired, and covered with flash indicator material, such as a sheet-like, heat-sensitive plastic material 48, for example biaxially oriented polypropylene, which shrinks or melts when subjected to heat or radiant energy from an adjacent flashing lamp thus effectively changing the color of the openings in the indicia sheet 43 and indicating which lamps have been flashed. Openings 51 are provided through the reflector unit 41 and the circuit board 42 to facilitate radiation from flashing lamps reaching and flash indicators. The rear housing member 37 is transparent (either of clear material or provided with window openings) to permit viewing of the indicia on the indicia sheet 43. The front housing member 36 is transparent at least in front of the lamps 22, etc., to permit light from flashing lamps to emerge frontwardly of the array, and may be tinted to alter the color of light from the flash lamps.

The height and width of the rectangular array are substantially greater than its thickness, and the heights and widths of the reflector member 41 and circuit board 42 are substantially the same as the interior height and width of the housing member 36 to facilitate holding the parts in place.

The tab 18, which is integral with the circuit board 42, is provided with a pair of electrical terminals 31 and 32, and similarly the tab 18' is provided with a pair of terminals 31' and 32', for contacting terminals of a camera socket for applying firing voltage pulses to the array. Each tab is provided with a third terminal 33 and 33', respectively, which functions to electrically short the circuitry of the inactive lower group of lamps when the array is plugged into a socket. The terminals 31 and 31' are shown as having a lateral "T-bar" configuration for temporarily shorting the socket terminals while the array is being plugged in, to discharge any residual voltage charge in the firing pulse source and also to reduce the likelihood of lamps being accidentally flashed by electrostatic voltage when the array is handled. The latter is achieved because the "T-bar" terminal is more readily touched than the other terminals by an electrostatically charged person, and, being connected to the large-area electrical ground circuitry, the charge tends to become dissipated into surrounding space instead of passing through the primers of the flash lamps.

The circuit board 42 has a "printed circuit" thereon, as will be described, for causing sequential flashing of the lamps by firing voltage pulses applied to the terminals 31, 32 or 31', 32'. The top and bottom halves of the printed circuitry preferably are reverse mirror images of each other. The lead wires 22a, 22b, etc., of the lamps 22, etc., may be attached to the circuit board 42 in various ways, such as by means of metal eyelets 22a', 22b', etc., placed through openings in the board. The lead wires 22a, 22b, etc., pass through openings 52 in the reflector member 41 and into or through the respective pairs of eyelets 22a', 22b', etc., and the ends of the eyelets are crimped or bent to hold the lead wires and make electrical contact thereto and also to hold the eyelets in place with their heads in electrical contact with the circuit of the circuit board.

Areas 59 on the transparent front housing member 36 may be made opaque or partly opaque, such as by making the surface roughened at these areas, to fully or partly conceal the lamp lead-in wires 22a, 22b, etc. and/or the lower portions of the lamps, for improved appearance of the array.

The circuit board terminal 32 is part of a conductor run that is electrically connected to lead-in wire 24a of lamp 24 at the eyelet 24a' and terminates at radiation switches 61, 62, and 63 respectively positioned near lamps 24, 25, and 23. A circuit board conductor run 64 is connected electrically to the remaining lead wire of flash lamp 25 at eyelet 25a' and terminates at the radiation switch 61. A circuit board conductor run 65 is connected to the remaining lead-in wire of flash lamp 23 at eyelet 23a' and terminates at the radiation switch 62. Similarly, a circuit board conductor run 66 is connected to the remaining lead-in wire of flash lamp 22 at eyelet 22b' and terminates at radiation switch 63.

The radiation switches 61, 62, and 63 are respectively in contact with and bridge across the circuit runs that are connected to them. The material for the radiation switches may be suitable material initially having an open circuit or high resistance, the resistance thereof becoming zero or a low value when the material receives radiation in the form of heat and/or light from a respective adjacent lamp, upon the lamp being flashed. For this purpose, each of the radiation switches is respectively positioned behind and near to a flash lamp 24, 25, 23. Windows in the form of transparent sections or openings 69 may be provided in the reflectors in front of the switches as shown in FIG. 3 to facilitate radiation transfer. A suitable material for the radiation switches is disclosed in U.S. Pat. No. 3,951,582 to Holub et al. Each of these radiation switches, upon receiving heat and/or light radiation from the adjacent lamp when it is flashed, changes from an open circuit or high resistance to a closed circuit or low resistance between its switch terminals on the circuit board.

As has been explained, the lower portion of the circuit board contains a substantially reverse mirror image of the same circuit shown in the upper part of the circuit board, and therefore will not be described in detail. It will be noted that the circuit runs from the plugged-in terminals 31 and 32 at the lower part of the circuit board extend upwardly so as to activate the circuitry in the upper half of the circuit board. Similarly, when the unit is turned around and tab 18' is plugged into a socket, the circuit board terminals 31' and 32' will be connected to and activate the lamps which then will be in the upper half of the circuit board, and hence in the upper half of the flash unit 17. This accomplishes, as has been stated, the desirable characteristic whereby only the group of lamps relatively farthest away from the lens axis will be flashed, thereby reducing or eliminating the undesirable red-eye effect.

The circuit on the circuit board 42 functions as follows. Assuming that none of the four lamps in the upper half of the unit 17 have been flashed, upon occurrence of a first firing pulse applied across the terminals 31, 32, this pulse will be directly applied to the lead-in wires of the first-connected flash lamp 24, whereupon the lamp 24 flashes and becomes an open circuit between its lead-in wires. Heat and/or light radiation from the flashing first lamp 24 causes the adjacent radiation switch 61 to become a closed circuit (or a low value of resistance), thereby connecting the circuit board terminal 32 electrically to the lead-in wire of the second lamp 25 at eyelet 25a'. By the time this occurs, the firing pulse has diminished to a value insufficient to cause the second lamp 25 to flash. When the next firing pulse occurs, it is applied to the lead-in wires of the second lamp 25, via the now closed radiation switch 61, whereupon the second lamp 25 flashes, thereby causing radiation switch 62 to assume zero or low resistance, and the second lamp 25 now has an open circuit or high resistance between its lead-in wires. When the next firing pulse occurs, it is applied via now closed radiation switch 62 to the third lamp 23, thereby firing the lamp which becomes an open circuit, and the radiation from it causes the radiation switch 63 to become essentially a closed circuit across its terminals. Thus, the next firing pulse will be applied, via now closed radiation switch 63, to the lead-in wires of the fourth flash lamp 22, thereupon causing the lamp to flash. Since this lamp is the last lamp in the active circuit, it does not matter whether its lead-in wires are an open or closed circuit after flashing. Additional flash lamps, radiation switches, and electrical conductors can be employed, if desired, using the just described principles. When the flash unit is turned around the other connector tab 18' attached to the camera socket, the group of lamps that then become uppermost and relatively farthest away from the lens axis will be in an active circuit and will be flashed in the same manner as has been described. In a preferred embodiment, the lamps 22, etc., are high voltage types, requiring up to 2000 volts for example, at low current, for flashing, and they can be fired by impacting or stressing a piezoelectric element in the camera.

Last-flash indicator radiation switches 70 and 70' are provided on the circuit board 42 respectively behind the last-to-flash lamps 22 and 30 of each of the groups 21 and 26 of lamps. Openings 71 and 71' are respectively provided in the reflectors 22' and 30' between the lamps 22 and 30 and switches 70 and 70' to facilitate radiation from the lamps when flashed reaching the switches. The last-flash indicator switches 70 and 70' can be the same material, and may also be approximately the same size and shape, as the flash-sequencing switches 61, etc. The circuit runs are shaped so that the last-flash indicator switch 70 bridges across and between the circuit run 72 which terminates at the connector terminals 32 and 33', and the common electrical ground circuit run 58 which terminates at the connector termainals 31 and 31', so that when this switch assumes a low or zero value of resistance in response to the flashing of the last lamp 22, it will actuate the last-flash indicator circuit in the camera via its electrical connection thereto through the connector terminals 31 and 32 which have previously functioned to connect firing pulses to the flash lamps. Similarly, the last-flash indicator switch 70' behind the other last-to-flash lamp 30 bridges across and between the common ground circuit run 58 and the circuit run 72' which terminates at the connector terminals 33 and 32', so that when the connector 18' is plugged into the camera the switch 70' will function as has been described for switch 70.

One or both of the openings 71 and 71' through the reflector unit 41 are shaped and contoured so as to bring the metal coating on the front of the reflector unit near to or in contact with a portion of the electrical ground circuit run 58, adjacent to the respective last-flash indicator switch 70 and/or 70', for example as shown in FIG. 4. In the embodiment of FIG. 4, the rear edge of the opening 71 (and/or the opening 71') is contoured to provide a tab 73 extending rearwardly from the reflector unit and positioned to extend against or adjacent to the electrical ground run 58 near the last-flash indicator switch 70 (and/or switch 70'). The metal coating on the front surface of the reflector unit extends rearwardly on the inner surface (toward the opening 71) of the tab 73 so as to be brought near to or against the electrical ground circuit run 58. The inner surface of the tab 73 may be tapered or sloped inwardly toward the radiation switch as shown to facilitate the metal coating being applied thereon when the front surface of the reflector unit is metallized, such as by a metal vapor deposition coating process. The electrical ground circuit run 58 may be widened or otherwise shaped to form an electrical ground pad area 76 adjacent to the last-flash indicator switch 70 (and/or 70').

The openings 71 and 71' perform dual functions of facilitating radiation from the last-to-flash lamps 22 and 30 reaching the last-flash indicator switches 70 and 70', and by their rear edge contour, such as the tabs 73, extending to an electrical ground run of the circuitry, they effectively electrically ground the reflector unit so that any electrostatic charges applied to the circuitry or array by a charged person or object are dissipated into surrounding space without going through any lamp primers, thereby reducing the possiblity of accidental flashing of lamps by the electrostatic charge. Thus, an electrostatic charge applied to the "T-bar" terminals 31, 31' will become dissipated via the large areas of the circuitry ground and the reflector unit, and an electrostatic charge applied to the plastic housing 36 will become dissipated via the large areas of the reflector unit and the circuitry ground. The metal coating of the front surface of the reflector unit can be brought, by means of the tabs 73, into contact with the electrical ground run of the circuit board, or sufficiently near thereto so that electrostatic charges of sufficient voltage to cause lamps to flash (about 1000 volts or more, for example) will arc between the electrical ground run and the reflector unit's conductive surface and become dissipated into surrounding space. The tab 73 further functions as a spacer to prevent the reflector metal coating at the remaining portion of the rear edges of the openings 71 and 71' from short-circuiting the switches 70 and 70' and the adjacent circuit runs, and also prevents flash lamp firing pulses from arcing from these switches and adjacent circuit runs to the conductive coating on the reflector unit, thus preventing malfunctioning of the array.

The inventive concept of contouring the rear edge of a reflector opening for contacting a circuit conductor adjacent to a radiation switch, can be embodied with various types of conductive reflector construction, such as an all-metal reflector unit, and a reflector unit of electrically insulative material coated with metal or other electrically conductive material on the front and-/or rear surfaces thereof. These various types of construction are contemplated by the terminology "conductive reflector" in the claims.

While preferred embodiments of the invention have been shown and described, various other embodiments and modifications thereof will become apparent to persons skilled in the art, and will fall within the scope of the invention as defined in the following claims.

What we claim as new and desire to secure by Letters Patent of the United States is:

1. A flash lamp unit comprising first and second connector terminals for receiving lamp-firing electrical signals and arranged so that said first terminal is more readily touched than said second terminal when the array is handled by a person, said unit further comprising a flash lamp, an electrically conductive reflector positioned behind said lamp, first and second circuit conductors positioned behind said reflector, means connecting said first circuit conductor to said first connector terminals, and a radiation-actuated switch positioned behind said reflector and bridging across said circuit conductors, said reflector being provided with an opening in front of said radiation-actuated switch, the rear edge of said opening being contoured so as to bring said conductive reflector sufficiently near to only said first circuit conductor for causing electrostatic charges to pass between said first circuit conductor and said conductive reflector.

2. A flash unit as claimed in claim 1, in which said rear edge of the opening is contoured to form a rearwardly extending tab which engages against said first one of the circuit conductors.

3. A flash unit as claimed in claim 2, in which said reflector comprises electrically insulative material having an electrically conductive coating on the front surface thereof.

4. A flash unit as claimed in claim 3, in which the inner surface of said tab facing toward said opening is tapered inwardly toward said radiation switch.

5. A multiple flash lamp array comprising a circuit board having lamp flashing circuitry thereon, a group of flash lamps positioned in front of said circuit board and having lead-in conductors connected to said circuit board, said array being provided with first and second connector terminals for receiving lamp-firing electrical signals, said circuitry comprising means for firing said lamps sequentially by said signals until a last-to-flash one of said lamps has been flashed, said circuitry further comprising first and second spaced-apart circuit conductors on the circuit board behind said last-to-flash lamp and respectively connected electrically to said first and second connector terminals, a radiation-actuated last-flash indicator switch connected electrically across said first and second conductors behind said last-to-flash lamp, and an electrically conductive reflector unit positioned between said lamps and said circuit board, said reflector unit being provided with an opening therethrough in front of said last-flash indicator switch to permit the switch to receive radiation from said last-to-flash lamp when flashed, the rear edge of said reflector unit opening being contoured so as to bring said conductive reflector sufficiently near to only said first circuit conductor for causing electrostatic charges to pass between said first conductor and said conductive reflector unit.

6. A flash array as claimed in claim 5, in which said rear edge of the reflector opening is contoured to form a rearwardly extending tab which engages against said first circuit conductor.

7. A flash array as claimed in claim 6, in which said reflector unit comprises electrically insulative material having an electrically conductive coating on the front surface thereof.

8. A flash array as claimed in claim 6, in which the inner surface of said tab facing toward said opening is tapered inwardly toward said radiation switch.

9. A flash array as claimed in claim 5, in which said first and second circuit conductors comprise circuit runs on said circuit board respectively integral with said first and second connector terminals, the circuit run comprising said first circuit conductor being widened adjacent to said last-flash indicator switch to facilitate engagement of said first circuit conductor by said contoured rear edge of the reflector opening.

10. A flash array as claimed in claim 5, in which said first connector terminal is arranged to be more readily touched when the array is handled by an electrostatically charged person than is said second connector terminal.

11. A flash array as claimed in claim 5, in which said last-flash indicator switch comprises radiation-sensitive material initially having a relatively high value of impedance across said first and second connector terminals and adapted to become converted by radiation from said last-to-flash lamp when it becomes flashed so as to have a relatively lower value of impedance across said first and second connector terminals.

12. A flash array as claimed in claim 11, including flash-sequencing circuitry comprising a flash-sequencing radiation switch of radiation-sensitive material initially having relatively high value of impedance and positioned to receive radiation from one of said lamps when flashed other than said last-to-flash lamp and adapted to become converted thereby so as to have a relatively lower value of impedance, said circuitry being arranged so that said flash-sequencing switch when converted will cause the next of said lamp-firing electrical signals to be applied to said last-to-flash lamp, said material of the last-flash indicator switch being substantially the same as said material of the flash-sequencing switch.

13. A flash array as claimed in claim 11, including a housing having oppositely disposed first and second ends, said group of flash lamps being positioned in said housing in the half thereof toward said first end thereof and said first and second connector terminals being positioned at said second end of the housing, a second group of flash lamps positioned in said housing in the half thereof toward said second end thereof and of which one of the lamps is to be flashed last, additional first and second conector terminals positioned at said first end of the housing and adapted to receive lamp-firing electrical signals for causing said lamps of the second group to flash, a second last-flash indicator switch comprising a radiation-sensitive material connected electrically between said additional first and second terminals and initially having a relatively high value of impedance across said additional first and second terminals and positioned to receive radiation from said last-to-flash lamp of the second group when it becomes flashed and adapted to become converted thereby so as to have a relatively lower value of impedance across said additional first and second terminals.

* * * * *